(12) United States Patent
Schneider et al.

(10) Patent No.: US 8,166,876 B2
(45) Date of Patent: May 1, 2012

(54) METHOD AND DEVICE FOR TRANSFERRING A PATTERN FROM A STAMP TO A SUBSTRATE

(75) Inventors: Ronald Maarten Schneider, Eindhoven (NL); Marinus Josephus Jakobus Dona, Veldhoven (NL); Michel Marcel Jose Decre, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1214 days.

(21) Appl. No.: 11/913,320

(22) PCT Filed: May 1, 2006

(86) PCT No.: PCT/IB2006/051352
§ 371 (c)(1),
(2), (4) Date: Nov. 1, 2007

(87) PCT Pub. No.: WO2006/117745
PCT Pub. Date: Nov. 9, 2006

(65) Prior Publication Data
US 2008/0202365 A1     Aug. 28, 2008

(30) Foreign Application Priority Data
May 3, 2005   (EP) .................................. 05103706

(51) Int. Cl.
*B41F 1/00* (2006.01)
(52) U.S. Cl. ......................... 101/287; 101/41; 101/327
(58) Field of Classification Search .................. 101/287, 101/41, 327
See application file for complete search history.

(56) References Cited

U.S. PATENT DOCUMENTS

| 5,669,303 | A | * | 9/1997 | Maracas et al. ............... 101/327 |
| 5,900,160 | A | | 5/1999 | Whitesides et al. |
| 5,947,027 | A | | 9/1999 | Burgin et al. |
| 7,037,458 | B2 | * | 5/2006 | Ford .............................. 264/293 |
| 7,691,313 | B2 | * | 4/2010 | Choi et al. ..................... 264/299 |
| 2003/0136281 | A1 | * | 7/2003 | Clark et al. ...................... 101/41 |
| 2004/0197712 | A1 | | 10/2004 | Jacobson et al. |
| 2005/0139103 | A1 | * | 6/2005 | Cracauer et al. .............. 101/327 |
| 2006/0130692 | A1 | * | 6/2006 | Peterman et al. ............. 101/485 |

FOREIGN PATENT DOCUMENTS

| EP | 0794015 A1 | 10/1997 |
| WO | 9706013 | 2/1997 |
| WO | 03023082 A2 | 3/2003 |
| WO | 03099463 A2 | 12/2003 |

* cited by examiner

*Primary Examiner* — Daniel J Colilla
*Assistant Examiner* — Allister Primo
(74) *Attorney, Agent, or Firm* — Larry Liberchuk

(57) ABSTRACT

A device (1) for transferring a pattern (12) from a stamp (10) to a substrate (20) comprises a table (22) for supporting a substrate (20), a flexible stamp (10) and a movably arranged body (25) having a pressure chamber (27) for exerting pressure on a portion of the stamp (10), so that the portion is pushed toward the substrate (20) and contacts the substrate (20). During a pattern transferring process, the body (25) is moved. As a result, adjacent portions of the stamp (10) successively go through a process of being pushed toward the substrate (20), getting in contact with the substrate (20), and being allowed to move back in place again. In this way, it is achieved that the pattern (12) of the stamp (10) is transferred to the substrate (20), without the introduction of vibrations, so that the transfer of the pattern (12) takes place in a highly accurate fashion.

12 Claims, 2 Drawing Sheets

METHOD AND DEVICE FOR TRANSFERRING A PATTERN FROM A STAMP TO A SUBSTRATE

Figure 1:
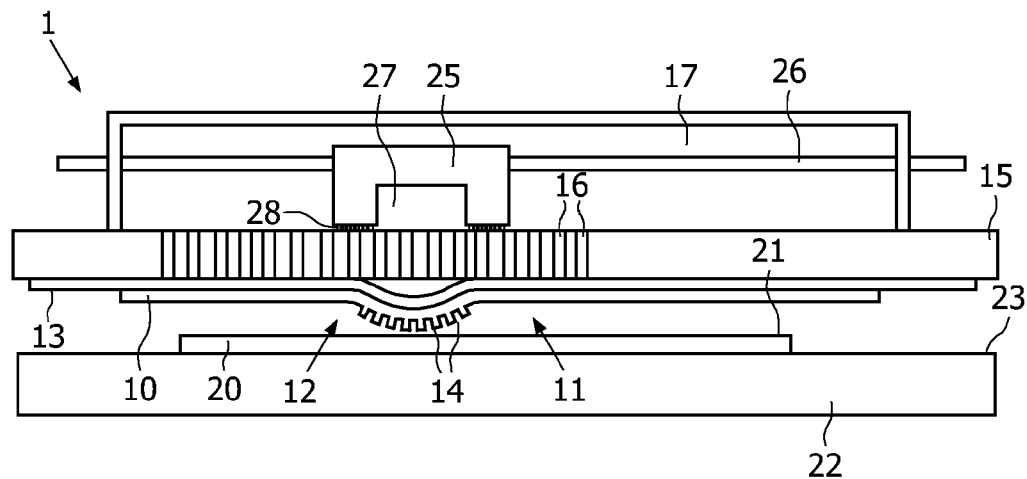

The present invention relates to a method for transferring a pattern from a stamping surface of a stamp to a receiving surface of a substrate, wherein at least one of the stamping surface and the receiving surface is flexible, wherein successive transfer areas, in which the stamp locally transfers the pattern to the substrate, are created for a period of time and subsequently removed.

Such a method is especially suitable to be applied in the field of microcontact printing, which is considered as one of the enablers of printable electronics. In microcontact printing, the features of the pattern to be transferred are in the micron and submicron range. In particular, the pattern comprises microstructures having elevated portions.

Usually, in microcontact printing, an ink comprising so-called alkane thiol molecules is applied. Initially, the stamp is filled with these molecules by immersing the stamp in a solution, wherein the molecules are absorbed by the stamp. When elevated portions of the microstructures in the stamp contact a noble metal, the thiol molecules diffuse through the stamp, forming a so-called self-assembled monolayer on the metal surface. The thickness of this monolayer is only a few nanometres. The monolayer is only present on portions of the metal surface which have contacted the elevated portions of the microstructures of the stamp.

In a subsequent etching process, the monolayer serves as a resist to protect the metal. Surface portions which are covered by the monolayer are protected against etching, while the unprotected metal is removed. Eventually, the original pattern of microstructures in the stamp is replicated in a metal surface, via a monolayer. The above-described process of microcontact printing and etching can be repeated several times, so that a specific pattern comprising various layers is obtained on the metal surface. Before a process of printing a new layer is carried out, it is important that the stamp is accurately positioned with respect to layers already present on the surface.

The method as specified in the opening paragraph is known, for example from WO 03/099463. According to the known method, the pattern is transferred from the stamping surface of a stamp to the receiving surface of a substrate by successively bringing portions of the pattern within such a range of the receiving surface during a certain period that the pattern is locally transferred from the stamping surface to the receiving surface. In particular, the application of individual actuators for moving the individual portions is disclosed. By successively operating adjacent actuators, it is achieved that transfer areas in which transfer of the pattern takes place appear like one transfer area moving like a wave between the stamping surface and the receiving surface.

An important advantage of successively creating the transfer areas is that during the transfer of the pattern no air bubbles will be entrapped between the stamping surface and the receiving surface, even in case both surfaces are planar.

In a practical embodiment of a device for carrying out the method as disclosed in WO 03/099463, three layers are distinguishable. A first layer comprises a soft elastomeric stamp having the stamping surface. Preferably, the stamp is attached to a flexible back plate, which is a polymer plate, or a thin plate of glass, for example. A second layer comprises a plurality of nozzles or grooves, arranged in a groove plate. Each nozzle is associated with a valve, which is part of a third layer, and which can switch between vacuum and a mild overpressure of about 2 kPa. The third layer also comprises supply channels and means for addressing the valves individually.

The device is applied for transferring a pattern from the stamping surface of the stamp to the receiving surface of a substrate. The substrate is positioned at a predetermined distance from the stamp, for example at a distance of 100 μm. During operation of the device, the whole of the stamp and the back plate is held against the groove plate by vacuum. The valves are opened and closed again in a desired order. As soon as a valve is opened, air flows into the associated nozzle, and, as a consequence, an associated portion of the stamping surface of the stamp is pushed toward the receiving surface of the substrate. In that situation, transfer of the pattern on the portion of the stamping surface to the receiving surface of the substrate takes place. After a predetermined period of time, the valve is closed again, and the portion of the stamping surface of the stamp is subjected to vacuum again, as a result of which the portion moves back to its initial position, in which it is held against the groove plate. By opening and closing adjacent valves, areas in which the stamping surface of the stamp is urged toward the receiving surface of the substrate appear like one area moving like a wave between the stamping surface and the receiving surface.

Application of the device yields very good results, especially for printing with micrometre accuracy. However, when a higher accuracy is required, the device is less satisfactory. It appears that switching the valves from vacuum to overpressure introduces vibrations, which lead to distortions of the transferred pattern. Therefore, there is a need for another practical way of carrying out the method known from WO 03/099463. The present invention fulfills this need by providing a new method and a new device for transferring a pattern from a stamping surface of a stamp to a receiving surface of a substrate. In the new method according to the present invention, at least one actuation unit having actuating means for moving a portion of a flexible one of the stamping surface and the receiving surface in a direction toward another of the stamping surface and the receiving surface is applied, wherein the actuation unit and the partially actuated surface are moved with respect to each other.

In the following, the method according to the invention will be explained, wherein, for the sake of simplicity, it is assumed that the actuation unit acts on the stamping surface. That does not alter the fact that it is also possible that the actuation unit acts on the receiving surface.

According to an important aspect of the method according to the present invention, the stamping surface and the actuation unit are moved with respect to each other. Given the fact that the mutual movement may be a continuous, uninterrupted movement, it is possible for the actuation unit to successively move adjacent portions of the stamping surface toward the receiving surface, in other words, to successively create adjacent transfer areas, without introducing vibrations and deformations.

Within the scope of the present invention, the mutual movement of the actuation unit and the stamping surface may be realized in every possible way, i.e. by moving both the actuation unit and the stamping surface, by moving only the actuation unit and keeping the stamping surface at a fixed position, or by moving only the stamping surface and keeping the actuation unit at a fixed position. For example, the actuation unit may be moved over a back side of the stamp, while the stamp is kept fixed. It is also possible that both the stamping surface and the receiving surface are moved at substantially the same speed and in substantially the same direction, wherein the actuation unit is arranged at a fixed position, and wherein a back side of the stamp is moved along the actuation unit. When the movements are of a continuous nature, the introduction of vibrations is surely avoided, and the transfer of the pattern from the stamping surface of the stamp to the receiving surface of the substrate takes place in a sufficiently accurate manner, also in case the features of the pattern are in the nanometre range.

A device for carrying out the method according to the present invention comprises means for suspending a substrate, means for suspending a stamp, and at least one actuation unit, and is adapted to establishing an arrangement in which the actuation unit and the surface to be partially actuated are movably arranged with respect to each other.

In a feasible embodiment, the device is adapted to moving only the actuation unit while keeping the stamping surface and the receiving surface in place. In such an embodiment, for example, the device may comprise a guiding bar, wherein the actuation unit is mounted on the guiding bar, and wherein the actuation unit is movably arranged with respect to the guiding bar.

In another feasible embodiment, the device is adapted to moving both the stamp and the substrate, while keeping the actuation unit at a fixed position. In such an embodiment, for example, the device may comprise two pairs of rotatable reels, wherein one of the pairs of rotatable reels is arranged for suspending the stamp, wherein another of the pairs of rotatable reels is arranged for suspending the substrate, and wherein the actuation unit is fixedly arranged at a position where a back side of one of the stamp and the substrate passes during operation of the device.

The actuation unit and the actuation means may be designed in any suitable way, wherein it is important that the actuation means are designed to act on a portion of one of the stamping surface and the receiving surface in order to move this portion. For example, the actuation unit may comprise a slider body partially enclosing a pressure chamber, wherein the pressure chamber is open to the stamp. When such an actuation unit is moved over a back side of a stamp, portions of the stamp are pushed toward the substrate by the actuation unit as soon as these portions are under the influence of the pressure prevailing in the pressure chamber, and move back to their initial positions again as soon as these portions are no longer in communication with the pressure chamber.

It is noted that US 2004/0197712 discloses a contact printing system in which a stamp is formed around support material which is attached to a spring that pulls both tight. A substrate is positioned in front of the stamp. For the purpose of bringing the stamp into contact with the substrate, a roller is applied, which is rolled along a back side of the stamp. Due to the rolling action of the roller, air is pushed ahead of the contact line between the stamp and the substrate, so that entrapment of air between the stamp and the substrate is prevented. In this way, it is eventually achieved that the substrate is contacted by the complete stamp.

An important difference with respect to the present invention is that a process in which successive transfer areas are created for a period of time and subsequently removed does not take place. Furthermore, the roller can not be regarded as an actuation unit having actuating means for moving a portion of the stamping surface in a direction toward the receiving surface of the substrate. In stead, the roller is a kind of pressing means for pressing the stamping surface against the receiving surface of the substrate, wherein contact between the stamping surface and the receiving surface is gradually built up from one side to another. Hence, when the contact printing system as disclosed in US 2004/0197712 is applied, it is not possible to control the time during which the transfer of the pattern takes place for different portions of the stamp. Contrariwise, in a situation in which the method according to the present invention is applied, it is possible to accurately control the time during which a portion of the stamping surface is urged toward the receiving surface under the influence of the actuation means of the actuation unit. Furthermore, in the contact printing system as disclosed in US 2004/0197712, due to the fact that the stamp is pulled tight by a spring, tensions in the stamp are obtained, which lead to deformations of the stamp and to inaccuracies in a process of contact printing.

The present invention further relates to a method for transferring a pattern from a stamping surface of a stamp to a receiving surface of a substrate, wherein at least one of the stamping surface and the receiving surface is flexible, wherein successive transfer areas, in which the stamp locally transfers the pattern to the substrate, are created for a period of time and subsequently removed by applying at least one actuation unit having actuating means for moving a portion of a flexible one of the stamping surface and the receiving surface in a direction toward another of the stamping surface and the receiving surface, wherein the actuation means are adapted to exerting a predetermined pressure on a portion of the partially actuated surface, wherein a mutual position of the stamp and the substrate is monitored throughout the pattern transferring process by looking at a pattern of the receiving surface of the substrate and the pattern of the stamping surface of the stamp, and wherein, in case a misalignment of the pattern of the receiving surface of the substrate and the pattern of the stamping surface of the stamp is found, the mutual position of the stamp and the substrate is corrected by displacing the stamp and the substrate with respect to each other until a proper alignment of the pattern of the receiving surface of the substrate and the pattern of the stamping surface of the stamp is obtained.

When printing a pattern comprising microstructures, it is very important that the stamp and the substrate are accurately positioned with respect to each other, especially in case a specific pattern is already present on the substrate, and it is desired to add a new layer to this pattern. According to the state of the art, a process of positioning the stamp and the substrate with respect to each other is carried out before the process of transferring the new pattern layer is started. According to a well-known alignment procedure, reference marks, which are arranged on both the stamping surface of the stamp and the receiving surface of the substrate, are used. However, in practice, during the pattern transferring process, a misalignment of the pattern of the stamping surface of the stamp and the pattern of the receiving surface of the substrate occurs, as a result of which the newly transferred pattern is displaced with respect to the pattern already present on the receiving surface of the substrate. The displacement may be even such that the substrate can not be used any further.

When the method according to the present invention is applied, the process of positioning the stamp and the substrate with respect to each other is also performed throughout the pattern transferring process. In case a misalignment is found, the mutual position of the stamp and the substrate is corrected by displacing the stamp and the substrate with respect to each other until a proper alignment of the pattern of the receiving surface of the substrate and the pattern of the stamping surface of the stamp is obtained. In this way, it is possible to control the mutual position of the stamp and the substrate in a highly accurate fashion, so that highly accurate results are obtained.

The method according to the present invention is applicable in a situation in which the actuation means are adapted to exerting a predetermined pressure on a portion of the partially actuated surface, as in that situation, at least a portion of the actuation means may be transparent. This is relevant in case means for looking at the stamping surface of the stamp and the receiving surface of the substrate are positioned at a side of the stamp and the substrate where the actuation means are also present.

A device which is suitable for carrying out the method according to the present invention comprises image detection means such as a camera, which are arranged for simultaneously looking at the receiving surface of the substrate and the stamping surface of the stamp; and interpreting and controlling means for interpreting images obtained by the image detection means and for controlling the mutual position of the stamp and the substrate on the basis of an outcome of the interpretation of the images, such as to obtain a proper alignment of the receiving surface of the substrate and the stamping surface of the stamp. In order to avoid obstruction of the view of the image detection means on the receiving surface of the substrate and the stamping surface of the stamp, components of the device in a path extending between the image detection means and the place where the images are to be taken are transparent.

Figure 2:
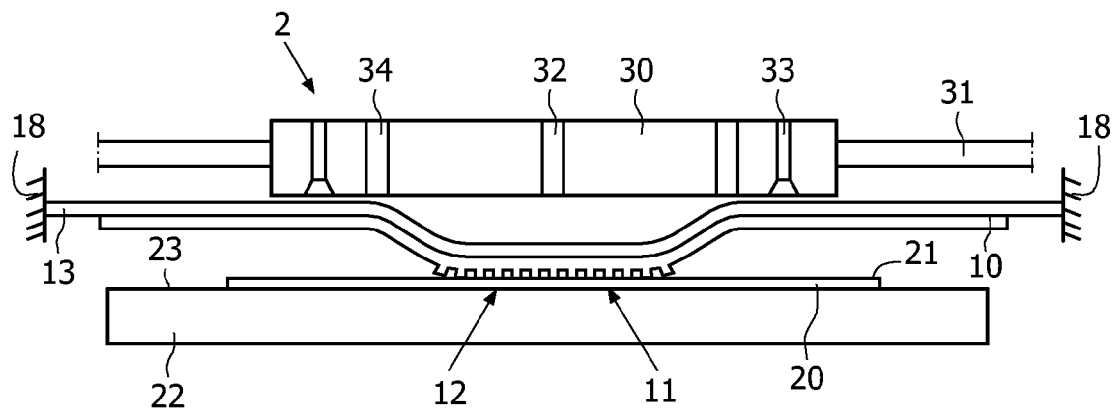
Figure 3:
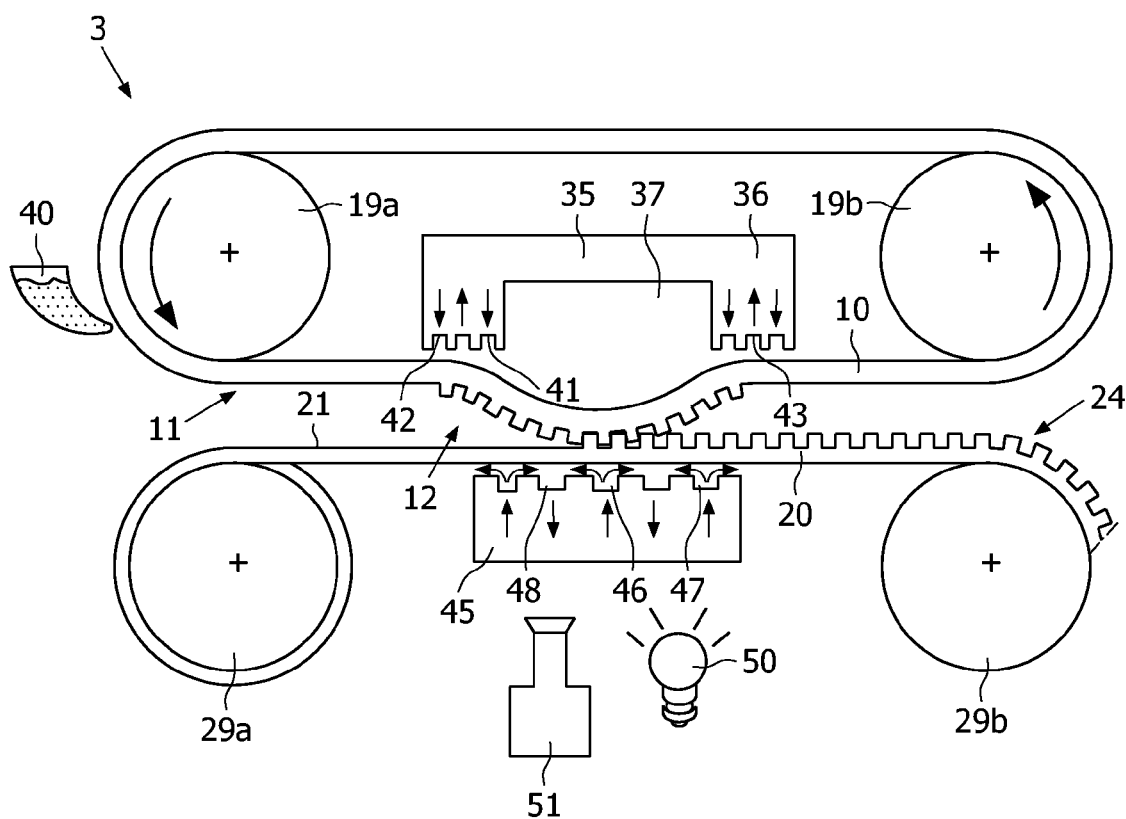

The present invention will now be explained in greater detail with reference to the Figures, in which similar parts are indicated by the same reference signs, and in which:

FIG. 1 diagrammatically shows a device according to a first preferred embodiment of the present invention;

FIG. 2 diagrammatically shows a device according to a second preferred embodiment of the present invention; and FIG. 3 diagrammatically shows a device according to a third preferred embodiment of the present invention.

In the Figures, for the purpose of illustrating some important details, portions of the devices shown are depicted in an enlarged fashion. Consequently, the Figures are not to be regarded as exact scale drawings of the devices.

FIG. 1 diagrammatically shows a device according to a first preferred embodiment of the present invention, which is indicated by means of reference sign 1. In the following, this device 1 will be referred to as first pattern transferring device 1.

The first pattern transferring device 1 serves for transferring a pattern 12 from a stamping surface 11 of a stamp 10 to a receiving surface 21 of a substrate 20. For the purpose of supporting the substrate 20, the first pattern transferring device 1 comprises a table 22 having a supporting surface 23. The substrate 20 is fixed on the table 22 by means of suitable fixing means (not shown). For example, the table 22 may be designed as a vacuum chuck, which is capable of holding the substrate 20 against the supporting surface 23 on the basis of vacuum.

The stamp 10 is made of a flexible material, such that it is very easy to deform the stamp 10. For example, the material of the stamp 10 is chosen such that it already gets locally deformed when a small portion of the stamp 10 is subjected to a very mild overpressure of only 1 kPa. In particular, the stamp 10 is made of a soft elastomeric material, such as a polydimethylsiloxane (PDMS) material.

The stamp 10 is attached to a back plate 13, which is a polymer plate, or a thin plate of glass, for example. The back plate 13 serves as a carrier of the stamp 10 and is also very flexible, in a direction out of plane. Consequently, the extent to which the whole of the stamp 10 and the back plate 13 is flexible in a direction out of plane is comparable to the extent to which only the stamp 10 is flexible.

The stamping surface 11 of the stamp 10 includes successive transferring surfaces 14 which define the pattern 12 to be transferred to the receiving surface 21 of the substrate 20. The features of the pattern 12 may be in the micron and submicron range. In FIG. 1, for sake of clarity, only a portion of the pattern 12 is diagrammatically depicted, in an enlarged fashion.

In the first pattern transferring device 1, the stamp 10 is positioned such that the stamping surface 11 is facing the supporting surface 23 of the table 22 or, in case a substrate 20 is placed on the table 22, the receiving surface 21 of the substrate 20. The whole of the stamp 10 and the back plate 13 is held by a stamp holding plate 15 having micro-holes 16, which are diagrammatically depicted in FIG. 1 as straight channels. In a practical embodiment, the stamp holding plate 15 comprises porous material in which a plurality of micro-holes 16 is present. For example, the stamp holding plate 15 is made of porous aluminium. However, the stamp holding plate 15 does not necessarily need to comprise porous material. For example, it is also possible that the stamp holding plate 15 comprises a plate in which a plurality of narrow channels is arranged.

At a back side of the stamp holding plate 15, i.e. the side of the stamp holding plate 15 which is not intended for contacting the stamp 10, a vacuum chamber 17 is arranged. During operation of the first pattern transferring device 1, under the influence of the vacuum prevailing in the vacuum chamber 17, the stamp 10 and the back plate 13 are held against the stamp holding plate 15, as the vacuum chamber 17 exerts a suction force on the stamp 10, through the micro-holes 16.

Inside the vacuum chamber 17, a slider body 25 is present, which is slidably arranged on a guiding bar 26. In a front side of the slider body 25, i.e. the side of the slider body 25 facing the stamp holding plate 15, a recess 27 is arranged, which, during operation of the first pattern transferring device 1, is applied as a pressure chamber 27. For example, a mild overpressure of about 2 kPa is prevailing in the pressure chamber 27.

The pressure chamber 27 is completely separated from the vacuum chamber 17 by the slider body 25. At the front side, the slider body 25 contacts the stamp holding plate 15 through a seal 28, so that leakage of air from the pressure chamber 27 to the vacuum chamber 17 is prevented.

The vacuum chamber 17 and the pressure chamber 27 are connected to suitable devices for supplying the vacuum and the pressure, respectively, through supply channels. For the sake of clarity, in FIG. 1, such devices and supply channels are not shown, given the fact that such devices and supply channels may be any suitable devices and supply channels known per se.

A portion of the stamp 10 which is present in front of the pressure chamber 27 is subjected to a pressure force caused by the pressure prevailing in the pressure chamber 27, wherein the pressure is transmitted through the micro-holes 16 in the stamp holding plate 15. As a result, this portion of the stamp 10 bulges toward the receiving surface 21 of the substrate 20, while the remaining portion of the stamp 10 is held against the stamp holding plate 15 under the influence of the vacuum prevailing in the vacuum chamber 17. For sake of completeness, it is noted that in the process, an associated portion of the back plate 13 moves along with the portion of the stamp 10 that is bulged. A top portion of the bulged portion of the stamp 10 contacts the receiving surface 21 of the substrate 20, and at the position where the contact is established, a portion of the pattern 12 is transferred from the stamping surface 11 to the receiving surface 21.

The slider body 25 is continuously moved with respect to the stamp holding plate 15 and the stamp 10, wherein the slider body 25 is guided along the guiding bar 26. Consequently, the pressure chamber 27 is continuously moved with respect to the stamp holding plate 15 and the stamp 10. In the process, the pressure chamber 27 remains separated from the vacuum chamber 17, through the seal 28.

As a result of the movement of the slider body 25 and the pressure chamber 27, the portion of the stamp 10 which is urged toward the receiving surface 21 of the substrate 20 gets continually replaced by an adjacent portion. The bulged portion of the stamp 10 moves along with the slider body 25 and the pressure chamber 27, as it were. When all portions of the stamp 10 on which a portion of the pattern 12 is present have been put in contact with the receiving surface 21 of the substrate 20, the transfer of the pattern 12 from the stamp 10 to the substrate 20 is completed.

An important advantage of the first pattern transferring device 1 is that alternating the condition at the back side of the stamp 10 between vacuum and overpressure does not involve any switching action which could cause vibrations in the device 1. In stead, the condition is alternated on the basis of a movement of the slider body 25 along the guiding bar 26. In this way, it is achieved that a generation of vibrations is avoided, especially in case the movement of the slider body 25 is of a continuous nature.

Furthermore, in the first pattern transferring device 1, the vacuum and the overpressure are very well controllable, as these conditions are maintained in one and the same chamber 17, 27. Also, the transition between the vacuum and the overpressure is very well controllable. If so desired, it is possible to have at least one other pressure regime between the vacuum and the overpressure. For example, the slider body 25 may comprise another recess surrounding the pressure chamber 27, wherein the pressure in this recess is kept at a level between vacuum and overpressure.

In the first pattern transferring device 1, positioning of the substrate 20 with respect to the stamp 10 is performed by moving the table 22 until the proper mutual position is obtained. For the purpose of moving the table 22, table positioning means (not shown) are provided, which may be any suitable positioning means known per se. Especially in case at least one pattern 12 has already been transferred to the substrate 20, it is important that a process of positioning the substrate 20 with respect to the stamp 10 is accurately performed, as the pattern 12 on the stamp 10 needs to be aligned with the pattern already present on the substrate 20.

Preferably, the position of the substrate 20 with respect to the stamp 10 is checked optically, i.e. by looking at the receiving surface 21 of the substrate 20 and the stamping surface 11 of the stamp 10. These surfaces 11, 21 may be provided with alignment marks, so that the proper mutual position may be obtained by looking at these marks and moving the table 22 until the positions of the marks on the surfaces 11, 21 correspond to each other. In a practical embodiment, the alignment marks may comprise so-called moiré patterns. However, it is also possible to look directly at both the pattern 12 on the stamp 10 and the pattern on the substrate 20, and to move the table 22 until the patterns are exactly aligned.

Within the scope of the present invention, it is possible to have the inspection of the mutual position of the stamp 10 and the substrate 20 performed by means of an image detection arrangement comprising cameras and lenses, for example. This possibility follows from the insight that, as a consequence of the fact that the stamp 10 is actuated by means of air pressure, the first pattern transferring device 1 may be transparent to a large extent. The stamp 10 and the back plate 13 may be made of a transparent material, and the same goes for elements of the first pattern transferring device 1 used for supplying the vacuum and the overpressure, which may be constructed from glass or another suitable transparent material.

Given the fact that the whole of the stamp 10 and the construction arranged behind the stamp 10 may be transparent, it is possible to monitor the mutual position of the stamp 10 and the substrate 20 throughout the process during which the pattern 12 of the stamp 10 is transferred to the substrate 20, and, if necessary, to take correcting actions in order to restore the proper mutual position. In this way, the accuracy of the pattern transferring process is even further enhanced, especially in case monitoring of the mutual position is performed by directly looking at the patterns on the stamp 10 and the substrate 20 and making a comparison of these patterns.

For the purpose of interpreting the images obtained by the cameras and controlling the table 22 in an appropriate manner, both at the start of the pattern transferring process and during the pattern transferring process, any suitable controller and software implementation may be applied. Preferably, a memory in which data regarding the patterns of the stamp 10 and the substrate 20 are stored is applied.

It is possible that only one camera is used for looking at the patterns on the stamp 10 and the substrate 20. Advantageously, in such case, the camera is arranged such as to be movable along with the slider body 25.

FIG. 2 diagrammatically shows a device according to a second preferred embodiment of the present invention, which is indicated by means of reference sign 2. In the following, this device 2 will be referred to as second pattern transferring device 2.

Like the first pattern transferring device 1, the second pattern transferring device 2 serves for transferring a pattern 12 from a stamping surface 11 of a flexible stamp 10 to a receiving surface 21 of a substrate 20, wherein the stamp 10 is supported by a back plate 13 and the substrate 20 rests on the supporting surface 23 of a movable table 22. In FIG. 2, for sake of clarity, only a portion of the pattern 12 is diagrammatically depicted, in an enlarged fashion.

An important difference between the first pattern transferring device 1 and the second pattern transferring device 2 is that the first pattern transferring device 1 comprises a stamp holding plate 15, a slider body 25 enclosing a pressure chamber 27, and a vacuum chamber 17, whereas the second pattern transferring device 2 comprises other components for holding the stamp 10 and actuating portions of the stamp 10.

In the second pattern transferring device 2, the stamp 10 and the back plate 13 are tightened in a stress-free fashion between two walls 18, which are diagrammatically depicted in FIG. 2. For the purpose of locally pushing the stamp 10 toward the substrate 20, a vacuum preloaded air bearing 30 is provided, which is arranged at the back side of the back plate 13, at a small distance. For example, the width of a gap between the air bearing 30 and the back side of the back plate 13 is only 5 to 10 µm. Furthermore, the air bearing 30 is slidably mounted on a guiding bar 31.

In general, air bearings are used for bearing objects in a contactless manner, wherein a thin layer of air is provided between the air bearing and the object. As air bearings are well-known in the art, these bearings and their operation will not be further explained here.

The air bearing 30 of the second pattern transferring device 2 as shown in FIG. 2 comprises a central groove 32 for supplying air in an overpressure condition to the back side of the whole of the back plate 13 and the stamp 10. During operation of the second pattern transferring device 2, a portion of the back plate 13 and an associated portion of the stamp 10 which are present in front of the central groove 32 are pushed toward the substrate 20. In the process, a portion of the stamping surface 11 of the stamp 10 contacts the receiving surface 21 of the substrate 20. The area in which the stamping surface 11 and the receiving surface 21 contact each other is a transfer area in which the pattern 12 of the stamp 10 is transferred to the receiving surface 21 of the substrate 20.

For the purpose of keeping a portion of the stamp 10 surrounding the portion which is pushed toward the substrate 20 under the influence of the overpressure in a proper position, i.e. a position right in front of the air bearing 30, the air bearing 30 comprises a vacuum groove 33 surrounding the central groove 32. On both sides of this vacuum groove 33, overpressure grooves for supplying an overpressure are arranged, in a way that is well-known in the field of preloaded air bearings. For sake of clarity, these overpressure grooves are not shown in FIG. 2. On the basis of an equilibrium between pressure forces exerted by the overpressure grooves and a suction force exerted by the vacuum groove 33, a force which is just right for keeping the stamp 10 and the back plate 13 in the proper position is realized, wherein contact between the air bearing 30 and the back plate 13 is avoided.

The air bearing 30 also comprises an intermediate groove 34, which is located between the central groove 32 and the vacuum groove 33. In this intermediate groove 34, atmospheric pressure is prevailing. In this way, the intermediate groove 34 serves for a better control of the transition between the overpressure and the vacuum. However, it is noted that the intermediate groove 34 is not essential for the operation of the second pattern transferring device 2, and that this groove 34 may therefore be omitted.

The various grooves 32, 33, 34 of the air bearing 30 are connected to suitable devices for supplying the vacuum and the pressure through supply channels. For the sake of clarity, in FIG. 2, such devices and supply channels are not shown, given the fact that such devices and supply channels may be any suitable devices and supply channels known per se.

During operation of the second pattern transferring device 2, the air bearing 30 is moved along the guiding bar 31, preferably in a continuous fashion. The movement of the air bearing 30 in the second pattern transferring device 2 has the same effect as the movement of the slider body 25 in the first pattern transferring device 1, namely that the portion of the stamp 10 which is urged toward the receiving surface 21 of the substrate 20 gets continually replaced by an adjacent portion. Also, in the second pattern transferring device 2, alternating the condition at the back side of the stamp 10 between vacuum or atmospheric pressure and overpressure does not involve any switching action, so that generation of vibrations in the second pattern transferring device 2 is avoided.

In the second pattern transferring device 2, a proper mutual position of the stamp 10 and the substrate 20 may be obtained in the same manner as has been described with respect to the first pattern transferring device 1. Also, measures may be taken for correcting the mutual position of the stamp 10 and the substrate 20 during the pattern transferring process, if necessary. Hence, the second pattern transferring device 2 may also comprise cameras and lenses, a controller, and a software implementation for interpreting images provided by the cameras and determining an associated movement of the table 22.

FIG. 3 diagrammatically shows a device according to a third preferred embodiment of the present invention, which is indicated by means of reference sign 3. In the following, this device 3 will be referred to as third pattern transferring device 3.

The third pattern transferring device 3 is adapted to performing the process of transferring a pattern 12 from a stamping surface 11 of a flexible stamp 10 to a receiving surface 21 of a flexible substrate 20 as a so-called reel-to-reel process. In FIG. 3, for sake of clarity, only a portion of the pattern 12 is diagrammatically depicted, in an enlarged fashion. The same applies to the pattern 24 which is obtained on the receiving surface 21 of the substrate 20 as a result of the pattern transferring process.

In the third pattern transferring device 3, the stamp 10 is shaped like a closed loop, wherein the stamp 10 is suspended on a pair of rotatable reels 19a, 19b. The substrate 20 having the receiving surface 21 for receiving the pattern 12 from the stamp 10 is also suspended on a pair of rotatable reels 29a, 29b. The reels 19a, 19b on which the stamp 10 is suspended are arranged at a certain mutual distance, such that the portions of the stamp 10 which are present between the reels 19a, 19b are substantially planar. In a similar fashion, the reels 29a, 29b on which the substrate 20 is suspended are arranged at a certain mutual distance, such that the portions of the substrate 20 which are present between the reels 29a, 29b are substantially planar. The positions of the pairs of reels 19a, 19b, 29a, 29b are adapted to each other in such a way that a portion of the stamping surface 11 of the stamp 10 faces a portion of the receiving surface 21 of the substrate 20, wherein a small gap is present between these surfaces.

At the back side of a portion of the stamp 10 located at a small distance from the substrate 20, a pressure unit 35 comprising a stamp bearing 36 and a recess 37 which serves as a pressure chamber 37 during operation of the third pattern transferring device 3 is arranged. In the pressure unit 35, the pressure chamber 37 is surrounded by the stamp bearing 36. The stamp bearing 36 serves for guiding the stamp 10, while the pressure chamber 37 serves for pressing a portion of the stamp 10 toward the substrate 20, such as to establish contact between a portion of the stamp 10 and the substrate 20, in order to realize a transfer of a portion of the pattern 12 from the stamp 10 to the substrate 20.

In this case, the stamp bearing 36 is a vacuum preloaded air bearing comprising an inner groove 41 and an outer groove 42 for exerting pressure, and an intermediate groove 43 for providing vacuum. In FIG. 3, the exerted pressure is indicated by means of downwardly directed arrows, and the vacuum is indicated by means of upwardly directed arrows.

For the purpose of guiding the substrate 20 during operation of the third pattern transferring device 3, a substrate bearing 45 is arranged. In the shown example, the substrate bearing 45 is a vacuum preloaded air bearing comprising a central groove 46 and an outer groove 47 for exerting pressure, and an intermediate groove 48 for providing vacuum. In FIG. 3, the exerted pressure is indicated by means of upwardly directed arrows, and the vacuum is indicated by means of downwardly directed arrows. Furthermore, the formation of an air cushion between the substrate bearing 45 and the substrate 20 is indicated by means of pairs of bent arrows.

Like FIGS. 1 and 2, for sake of clarity, FIG. 3 does not show any devices and associated supply channels for supplying vacuum and pressure to the grooves 41, 42, 43 of the stamp bearing 36 and the grooves 46, 47, 48 of the substrate bearing 45, which may be any suitable devices and supply channels known per se.

During operation of the third pattern transferring device 3, the reels 19a, 19b are rotated. In FIG. 3, a direction in which rotation may take place is indicated by arrows depicted in the reels 19a, 19b. As a result of the rotation of the reels 19a, 19b, the stamp 10 is moved along the pressure unit 35. In the process, the stamp 10 is guided by the stamp bearing 36, while a portion of the stamp 10 which is present in front of the pressure chamber 37 is moved toward the substrate 20, such that a portion of the stamping surface 11 of the stamp 10 contacts the receiving surface 21 of the substrate 20, wherein a portion of the pattern 12 is transferred from the stamp 10 to the substrate 20. In order to obtain a proper transfer of the pattern 12, it is important that the substrate 20 is moved as well, at substantially the same speed as the stamp 10, in the same direction. In this way, a continuous process is realized, in which adjacent portions of the stamp 10 are successively bulged under the influence of the pressure prevailing in the pressure chamber 37, and in which each newly bulged portion of the stamp 10 contacts a new portion of the receiving surface 21 of the substrate 20, which is located adjacent to a portion which has just been contacted. By applying such a process, it is possible to perform the pattern transferring process on relatively large areas.

Within the scope of the present invention, various processes may be applied for ensuring that the stamp 10 and the substrate 20 are moved at substantially the same speed. For example, it is possible to have a process in which the substrate 20 is moved along with the stamp 10 on the basis of friction occurring in the contact between the substrate 20 and the stamp 10. However, for example, it is also possible to have a process in which the rotational speed of driving reels of both pairs of reels 19a, 19b, 29a, 29b is accurately controlled.

The patterned portion of the substrate 20 is wound up on one of the reels 29a, 29b. If necessary, means for carrying out an additional step like a post-cure step or a drying step may be positioned between the relevant reel 29b and the substrate bearing 45.

Advantageously, the third pattern transferring device 3 comprises a station 40 for supplying ink to the stamp 10. In FIG. 3, such an ink supplying station 40 is diagrammatically depicted. In the shown example, the ink supplying station 40 is arranged such as to supply ink to portions of the stamp 10 which are moving toward the pressure unit 35, i.e. which are about to contact the substrate 20.

In particular cases, it may be necessary to use UV-light for curing the pattern 24 on the substrate 20. For the purpose of supplying UV-light, an UV-source 50 is used. In case both the substrate 20 and the substrate bearing 45 are transparent, the UV-source 50 may be arranged at a back side of the substrate bearing 45, i.e. a side of the substrate bearing 45 which is opposite to the side intended for facing the substrate 20.

An important advantage of the application of the third pattern transferring device 3 is that it is possible to provide continuous substrates 20 from a roll with a desired pattern 24, in stead of handling one substrate 20 at a time, as is the case in the first pattern transferring device 1 and the second pattern transferring device 2. The so-called reel-to-reel process which is carried out in the third pattern transferring device 3 is especially applicable when a flexible substrate 20 is used, and is an enabling technique for printing displays on wallpaper, printing transistors on flexible tape, printing micro arrays on tape, etc.

During operation of the third pattern transferring device 3, a pattern transferring process takes place at a portion of the stamp 10 where the stamp 10 is substantially planar. Consequently, the pattern 12 of the stamp 10 is not deformed, and transfer of the pattern 12 from the stamp 10 to the substrate 20 takes place in an accurate manner. Therefore, it is possible to perform a high accuracy pattern transferring process, wherein the dimensions of the pattern 12 may be in an order of 1 μm and below.

In case at least one pattern 24 is already present on the substrate 20, and a subsequent pattern 24 needs to be applied, it is important that the pattern 12 of the stamp 10 is accurately positioned with respect to the pattern(s) 24 of the substrate 20.

In the third pattern transferring device 3, given the fact that portions of the stamp 10 and the substrate 20 between the reels 19a, 19b, 29a, 29b are substantially planar, it is possible to actually meet the requirement of realizing an accurate mutual position of the stamp 10 and the substrate 20.

For the purpose of monitoring and controlling the mutual position of the patterns 12, 24 of the stamp 10 and the substrate 20, the third pattern transferring device 3 comprises a camera 51, which is connected to interpreting and controlling means (not shown) for interpreting the images obtained by the camera 51 and adjusting the position of at least one of the stamp 10 and the substrate 20 in case a correction of the mutual position of the stamp 10 and the substrate 20 appears to be necessary. Once the stamp 10 and the substrate 20 have been put in a correct mutual position at the start of a pattern transferring process, corrections of the mutual position are carried out during the pattern transferring process, while the movements of the stamp 10 and the substrate 20 are continued.

In respect of the third pattern transferring device 3, and also in respect of the other above-described pattern transferring devices 1, 2, it is noted that any suitable arrangement for aligning the stamp 10 and the substrate 20 with respect to each other may be applied. For example, the substrate 20 may be provided with alignment marks which are detectable by means of infrared-light, wherein the pattern transferring device 1, 2, 3 comprises an arrangement which is adapted to radiating infrared-light and detecting the alignment marks.

When the preferred option of directly looking at the patterns 12, 24 of the stamp 10 and the substrate 20 by means of at least one camera 51 is applied, it makes no difference whether the camera 51 is positioned at the side of the stamp 10 or at the side of the substrate 20. In either case, it is important that components arranged between the camera 51 and the patterns 12, 24 are transparent. When air pressure is used for actuating portions of the stamp 10, it is very well possible to apply transparent components.

All shown devices 1, 2, 3 are suitable to be used for the purpose of performing a pattern transferring process on substrates 20 having relatively large areas. Consequently, these devices 1, 2, 3 are suitable to be applied for the purpose of manufacturing displays, for example. Other possible applications are in the field of manufacturing plastic electronics, biosensors, retardation elements/wire grids, polarized back lights, lens arrays and micro arrays.

Within the context of the present invention, it is important that deformations in the stamp 10 and/or the substrate 20 are avoided. Therefore, it is important to have both the stamp 10 and the substrate 20 suspended in a stress-free fashion. Furthermore, the distance between the stamp 10 and the substrate 20 is relatively very small, in an order of micrometres. In this way, it is realized that bulging of the stamp 10 and/or the substrate 20, which takes place during the pattern transferring process, does not introduce a substantial deformation, so that the accuracy of the pattern transferring process is high with respect to many other pattern transferring processes known per se.

According to the present invention, the contact between the stamp 10 and the substrate 20 is established on the basis of a predetermined pressure. In this way, a predetermined contact pressure is obtained, which is important in view of the fact that the contact pressure may not be too low, in order for the transfer of the pattern 12 from the stamp 10 to the substrate 20 to be complete, while the contact pressure may also not be too high, in order to avoid deformation of the pattern 12. According to many known methods for transferring a pattern from a stamping surface of a stamp to a receiving surface of a substrate, for example the method as known from US 2004/0197712, the contact between the stamp 10 and the substrate 20 is established under the influence of a rigid member such as a roller or the like. In such methods, the contact pressure between the stamp 10 and the substrate 20 is influenced by characteristics of the stamp 10 and the substrate 20 at the places where contact is established. For example, at a place where an unevenness is present, the contact pressure is higher than at a place where this is not the case. In view of the desire to have a highly accurate pattern transferring process, it is most advantageous to have the contact between the stamp 10 and the substrate 20 established on the basis of a predetermined pressure.

It will be clear to a person skilled in the art that the scope of the present invention is not limited to the examples discussed in the foregoing, but that several amendments and modifications thereof are possible without deviating from the scope of the present invention as defined in the attached claims.

When the devices 1, 2, 3 as described in the foregoing are applied, portions of the stamp 10 are bulged toward the substrate 20 under the influence of pressure. In particular, a pressure chamber 27, 37 or groove 32 in which an overpressure is prevailing is applied for exerting pressure on the portions of the stamp 10. Within the scope of the present invention, it is not necessary that air is used for putting portions of the stamp 10 in contact with the substrate 20. For example, it is possible that the back layer 13 to which the stamp 10 is attached is magnetically active, and that portions of the stamp 10 are bulged under the influence of magnetic forces. It is also possible to apply piezoelectric actuators or other suitable types of actuating means.

In the shown examples, contact between the stamp 10 and the substrate 20 is realized by moving portions of the stamp 10 toward the substrate 20. In principle, within the scope of the present invention, it is also possible that the contact is established by moving portions of the substrate 20 toward the stamp 10, or by moving portions of both the stamp 10 and the substrate 20, provided that the substrate 20 is flexible.

In the first pattern transferring device 1 and the second pattern transferring device 2, the substrate 20 is placed on a movable table 22. In these devices 1, 2, a process of putting the stamp 10 and the substrate 20 in a proper position with respect to each other is carried out by moving the substrate 20 with respect to the stamp 10 by means of the table 22. Within the scope of the present invention, for the purpose of carrying out a positioning procedure, it is also possible that the substrate 20 is kept in place while the stamp 10 is moved, or that both the substrate 20 and the stamp 10 are moved.

The stamping surface 11 of the stamp 10 may be provided with any suitable ink which is known per se. For example, the ink may comprise molecules which are supplied to the stamping surface 11 by means of diffusion. At the places where the stamping surface 11 contacts the receiving surface 21 of the substrate 20, molecules are transferred from the stamping surface 11 to the receiving surface 21. It is also possible that another type of ink is used, which is transferred from the stamping surface 11 to the receiving surface 21 when the surfaces 11, 21 are within a close range with respect to each other, wherein physical contact between the surfaces 11, 21 is not necessary. In view of this, the wording "contact", when applied to the stamping surface 11 and the receiving surface 21, is supposed to cover both possibilities of physical contact and of being within a sufficiently close range in order for the stamping surface 11 to be able to transfer the pattern 12 to the receiving surface 21.

The method according to the present invention and the shown devices 1, 2, 3 are suitable to be applied in respect of various soft lithographic printing techniques, in particular techniques known as microcontact printing, embossing and imprinting. In microcontact printing, it is important that the pressure applied on the stamp 10 in order to put the stamp 10 in contact with the substrate 20 is limited, in order to avoid squeezing and distorting of the pattern 12 to be transferred. In embossing and imprinting, transfer of the pattern involves forming an imprint in a layer of ink which has been supplied to the receiving surface 21 of the substrate 20. Therefore, when those techniques are applied, the pressure should be high enough for making nice imprints.

In the foregoing, a method and devices 1, 2, 3 for transferring a pattern 12 from a stamping surface 11 of a stamp 10 to a receiving surface 21 of a substrate 20 are disclosed.

According to the state of the art as for example disclosed in WO 03/099463, for the purpose of carrying out a pattern transferring process, a matrix of actuators is applied, wherein the actuators are individually addressed to act on the stamp 10, in order to put associated portions of the stamp 10 in contact with the substrate 20. Thus, the pattern transferring process takes place in discrete steps. As a result, vibrations are generated, which have a negative influence on the transfer of the pattern 12, especially when the features of the pattern 12 are in the submicron range.

According to the present invention, the pattern transferring process is performed in a more continuous fashion, so that the generation of vibrations is avoided. A preferred way of achieving this advantageous effect involves moving the stamp 10 and a unit 25, 30, 35, which has a pressure chamber 27, 37 or groove 32 for exerting pressure on a portion of the stamp 10 in order to move the portion toward the substrate 20, with respect to each other. In general, an actuation unit 25, 30, 35 and the stamp 10 are moved with respect to each other. In the process, the stamp 10 and the substrate 20 are kept fixed with respect to each other, wherein only small displacements of the stamp 10 and the substrate 20 with respect to each other are realized in case a deviation from a predetermined mutual position of the stamp 10 and the substrate 20 is detected.

Among other things, a first pattern transferring device 1 is disclosed. This device 1 comprises a flexible stamp 10 mounted on a flexible back plate 13, a porous stamp holding plate 15 and a vacuum chamber 17, wherein the stamp 10 is held against the plate 15 under the influence of the vacuum prevailing in the vacuum chamber 17. In front of the stamp 10, a substrate 20 is positioned on a table 22.

Inside the vacuum chamber 17, a slidably arranged body 25 is arranged, which comprises a pressure chamber 27 for exerting pressure on a portion of the stamp 10, so that the portion is pushed toward the substrate 20 until it contacts the substrate 20. During a pattern transferring process, the body 25 is moved. As a result, adjacent portions of the stamp 10 successively go through a process of being pushed toward the substrate 20, getting in contact with the substrate 20, and being allowed to move back in place again. In this way, it is achieved that the pattern 12 of the stamp 10 is transferred to the substrate 20, without the introduction of vibrations, so that the transfer of the pattern 12 takes place in a highly accurate fashion.

A device (1) for transferring a pattern (12) from a stamp (10) to a substrate (20) comprises a table (22) for supporting a substrate (20), a flexible stamp (10) and a movably arranged body (25) having a pressure chamber (27) for exerting pressure on a portion of the stamp (10), so that the portion is pushed toward the substrate (20) and contacts the substrate (20). During a pattern transferring process, the body (25) is moved. As a result, adjacent portions of the stamp (10) successively go through a process of being pushed toward the substrate (20), getting in contact with the substrate (20), and being allowed to move back in place again. In this way, it is achieved that the pattern (12) of the stamp (10) is transferred to the substrate (20), without the introduction of vibrations, so that the transfer of the pattern (12) takes place in a highly accurate fashion.

The invention claimed is:

1. A method for transferring a pattern from a stamping surface of a stamp to a receiving surface of a substrate, wherein at least one of the stamping surface and the receiving surface is flexible, the method comprising:
creating for a period of time and subsequently removing successive transfer areas, in which the stamp locally transfers the pattern to the substrate, by applying at least one actuation unit for moving a portion of a flexible one of the stamping surface and the receiving surface in a direction toward another of the stamping surface and the receiving surface, wherein the at least one actuation unit and a partially actuated surface are moved with respect to each other during the transfer of the pattern from the stamping surface,
wherein the mutual movement of the at least one actuation unit and the partially actuated surface is a continuous, uninterrupted movement.

2. The method according to claim 1, wherein both the stamping surface and the receiving surface are moved at substantially the same speed and in substantially the same direction, wherein the at least one actuation unit is arranged at a fixed position, and wherein a back side of one of the stamp and the substrate is moved along the at least one actuation unit.

3. The method according to claim 1, wherein the at least one actuation unit is moved over a back side of one of the stamp and the substrate, while this one of the stamp and the substrate is kept fixed.

4. The method according to claim 1, wherein the at least one actuation unit is adapted to exert a predetermined pressure on a portion of the partially actuated surface.

5. A device, for application in a process of transferring a pattern from a stamping surface of a stamp to a receiving surface of a substrate, wherein at least one of the stamping surface and the receiving surface is flexible, the device comprising:
means for suspending a substrate having a receiving surface;
means for suspending a stamp having a stamping surface including a pattern; and
at least one actuation unit for moving a portion of a flexible one of the stamping surface and the receiving surface in a direction toward another of the stamping surface and the receiving surface;
wherein the at least one actuation unit and a surface to be partially actuated are moved with respect to each other,
wherein the mutual movement of the at least one actuation unit and the partially actuated surface is a continuous, uninterrupted movement.

6. The device according to claim 5, further comprising a guide, wherein the at least one actuation unit is mounted on the guide, and wherein the at least one actuation unit is movably arranged with respect to the guide.

7. The device according to claim 6, further comprising a vacuum chamber and a stamp holding plate having a plurality of holes, wherein the vacuum chamber is arranged on another side of the stamp holding plate than the side where the stamp is to be positioned, and wherein the at least one actuation unit is arranged inside the vacuum chamber.

8. The device according to claim 5, wherein the at least one actuation unit is adapted to exert pressure on a portion of the surface to be partially actuated.

9. The device according to claim 8, wherein the at least one actuation unit comprises a pressure chamber which is at a side where the stamp is to be positioned, and which is intended for containing air at an overpressure.

10. A method for transferring a pattern from a stamping surface of a stamp to a receiving surface of a substrate, wherein at least one of the stamping surface and the receiving surface is flexible, the method comprising:
creating for period of time and subsequently removing successive transfer areas, in which the stamp locally transfers the pattern to the substrate, by applying at least one actuation unit for moving a portion of a flexible one of the stamping surface and the receiving surface in a direction toward another of the stamping surface and the receiving surface, wherein the at least one actuation unit is adapted to exert a predetermined pressure on a portion of the partially actuated surface, wherein the at least one actuation unit and a surface to be partially actuated are movable with respect to each other during the transfer of the pattern from the stamping surface, and the mutual movement of the at least one actuation unit and the partially actuated surface is a continuous, uninterrupted movement,
monitoring a mutual position of the stamp and the substrate throughout the pattern transferring process by looking at a pattern of the receiving surface of the substrate and the pattern of the stamping surface of the stamp, and
in case a misalignment of the pattern of the receiving surface of the substrate and the pattern of the stamping surface of the stamp is found, correcting the mutual position of the stamp and the substrate by displacing the stamp and the substrate with respect to each other until a proper alignment of the pattern of the receiving surface of the substrate and the pattern of the stamping surface of the stamp is obtained.

11. A device, for application in a process of transferring a pattern from a stamping surface of a stamp to a receiving surface of a substrate, wherein at least one of the stamping surface and the receiving surface is flexible, wherein the device comprises:
means for suspending a substrate having a receiving surface;
means for suspending a stamp having a stamping surface including a pattern;
at least one actuation unit for moving a portion of a flexible one of the stamping surface and the receiving surface in a direction toward another of the stamping surface and the receiving surface, wherein the at least one actuation unit and a portion of a flexible one of the stamping surface are movable with respect to each other during the transfer of the pattern from the stamping surface, and the mutual movement of the at least one actuation unit and the portion of a flexible one of the stamping surface is a continuous, uninterrupted movement;
image detection means, which are arranged for simultaneously looking at the receiving surface of the substrate and the stamping surface of the stamp; and
interpreting and controlling means for interpreting images obtained by the image detection means and for controlling the mutual position of the stamp and the substrate on the basis of an outcome of the interpretation of the images, such as to obtain a proper alignment of the receiving surface of the substrate and the stamping surface of the stamp;
wherein components of the device in a path extending between the image detection means and the place where the images are to be taken are transparent.

12. The device according to claim 11, wherein the transparent components include at least a portion of the at least one actuation unit.

* * * * *